(12) United States Patent
Widiez et al.

(10) Patent No.: US 12,424,497 B2
(45) Date of Patent: Sep. 23, 2025

(54) METHOD FOR TRANSFERRING A LAYER FROM A SOURCE SUBSTRATE TO A DESTINATION SUBSTRATE

(71) Applicant: Commissariat à l'Énergie Atomique et aux Énergies Alternatives, Paris (FR)

(72) Inventors: Julie Widiez, Grenoble (FR); Frank Fournel, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 18/865,498

(22) PCT Filed: May 4, 2023

(86) PCT No.: PCT/EP2023/061790
§ 371 (c)(1),
(2) Date: Nov. 13, 2024

(87) PCT Pub. No.: WO2023/222398
PCT Pub. Date: Nov. 23, 2023

(65) Prior Publication Data
US 2025/0112094 A1    Apr. 3, 2025

(30) Foreign Application Priority Data

May 18, 2022 (FR) ..................... 2204713

(51) Int. Cl.
*H01L 21/00* (2006.01)
*B32B 37/00* (2006.01)
*H01L 21/78* (2006.01)

(52) U.S. Cl.
CPC ........ *H01L 21/7813* (2013.01); *B32B 37/025* (2013.01); *B32B 2457/14* (2013.01)

(58) Field of Classification Search
CPC ........... H01L 21/7813; H01L 21/02002; H01L 21/187; H01L 21/2007; B32B 37/025; B32B 2457/14
See application file for complete search history.

(56) References Cited

U.S. PATENT DOCUMENTS 6,908,832 B2    6/2005   Farrens et al.
2007/0023867 A1  2/2007   Aulnette et al.

FOREIGN PATENT DOCUMENTS

CN    1868054 A    11/2006
CN    101803002 A    8/2010
(Continued)

OTHER PUBLICATIONS

International Search Report and Written Opinion for International Application No. PCT/EP2023/061790, mailed Sep. 5, 2023.
(Continued)

*Primary Examiner* — Reema Patel
(74) *Attorney, Agent, or Firm* — Wolf, Greenfield & Sacks, P.C.

(57) ABSTRACT

A method of transferring a layer from a source substrate to a destination substrate, including the following steps: a) arranging a masking disk on a central portion of a bonding surface of said layer and/or of the destination substrate b) implementing an ion etching to form a step in front of a peripheral portion, not covered with the masking disk, of the bonding surface of said layer and/or of the destination substrate c) removing the masking disk; d) activating the bonding surface of said layer and the bonding surface of the destination substrate; and e) placing into contact the bonding surface of said layer with the bonding surface of the destination substrate.

11 Claims, 3 Drawing Sheets

(56) References Cited

FOREIGN PATENT DOCUMENTS

| | | |
|---|---|---|
| CN | 113380639 A | 9/2021 |
| JP | 2020-038916 A | 3/2020 |

OTHER PUBLICATIONS

Jourdain et al., Edge Trimming Induced Defects on Direct Bonded Wafers. J. of Electronic Packaging, Sep. 2018; 140:031004(1-6).
First Office Action for Chinese Application No. 202380038524.7, dated Jul. 1, 2025.

METHOD FOR TRANSFERRING A LAYER FROM A SOURCE SUBSTRATE TO A DESTINATION SUBSTRATE

This application is a national stage filing under 35 U.S.C. § 371 of International Patent Application Serial No. PCT/EP2023/061790, filed May 4, 2023, which claims priority to, French patent application 2204713 filed on May 18$^{th}$, 2022 and entitled "Procédé de transfert d'une couche depuis un substrat source vers un substrat destination". The contents of these applications are incorporated herein by reference in their entirety.

TECHNICAL BACKGROUND

The present disclosure generally concerns methods of manufacturing microelectronic components based on semiconductor materials. It more particularly aims at a method of transferring a semiconductor layer from a source substrate to a destination substrate.

PRIOR ART

In microelectronic component manufacturing methods, transfers of layers are currently used to transfer a relatively thin semiconductor layer of high crystal quality, onto a thicker destination substrate of lower crystal quality or made of a less expensive material.

After the transfer, the transferred layer may be used as a base for an epitaxy step. Microelectronic components can then be formed inside and on top of the epitaxial layer.

It would be desirable to at least partly overcome certain disadvantages of known methods for transferring a semiconductor layer from a source substrate to a destination substrate.

The improvement of the quality of the edges of the transfer layer is here more particularly considered.

SUMMARY OF THE INVENTION

An embodiment provides a method of transferring a layer from a source substrate to a destination substrate, comprising the following steps:
 a) arranging a masking disk on a central portion of a bonding surface of said layer and/or of the destination substrate;
 b) implementing an ion etching to form a step in front of a peripheral portion, not covered with the masking disk, of the bonding surface of said layer and/or of the destination substrate;
 c) removing the masking disk;
 d) activating the bonding surface of said layer and the bonding surface of the destination substrate by ion etching or ion deposition of a bonding material; and
 e) after step d), placing into contact the bonding surface of said layer with the bonding surface of the destination substrate,
 wherein steps b) and d) are successively implemented in a same ion treatment chamber; and
 wherein steps d) and e) are implemented under vacuum, with no rupture of vacuum between the two steps.

According to an embodiment, the destination substrate and/or the source substrate has tapered edges across a first width.

According to an embodiment, after step b), the step extends, from the edge of said layer and/or from the edge of the destination substrate, across a width greater than or equal to the first width.

According to an embodiment, the disk has a diameter smaller than the diameter of the source substrate and/or than the diameter of the destination substrate.

According to an embodiment, the method comprises, after step e), a step f) of removal of the source substrate.

According to an embodiment, step f) comprises an anneal step resulting in fracturing the assembly obtained at the end of step e), in the plane of an implanted buried layer separating said layer from the source substrate.

According to an embodiment, said layer is a semiconductor layer.

According to an embodiment, the method comprises, after step f), a step of epitaxy on top of and in contact with the surface of said layer opposite to the destination substrate.

According to an embodiment, after step b), the step extends down to a depth, from the bonding surface of said layer and/or the bonding surface of the destination substrate, greater than 700 nm.

According to an embodiment, step d) consists of the deposit of a bonding layer on the bonding surface of said layer and/or on the surface of the destination substrate.

According to an embodiment, the bonding layer has a thickness in the range from 0.2 nm to 100 nm, for example, in the range from 1 nm to 20 nm.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the methods of manufacturing microelectronic components based on the transferred semiconductor layers have not been detailed, the described transfer methods being compatible with all or most usual microelectronic component manufacturing methods.

In the following disclosure, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made, unless specified otherwise, to the orientation of the figures.

Unless specified otherwise, the expressions "around", "approximately", "substantially" and "in the order of" signify within 10%, and preferably within 5%.

FIG. 1A, FIG. 1B, FIG. 1C, FIG. 1D, FIG. 1E, and FIG. 1F are cross-section views, partially and schematically illustrating successive steps of an example of a method of transferring a semiconductor layer from a source substrate to a destination substrate according to a first embodiment.

Figure 1A:
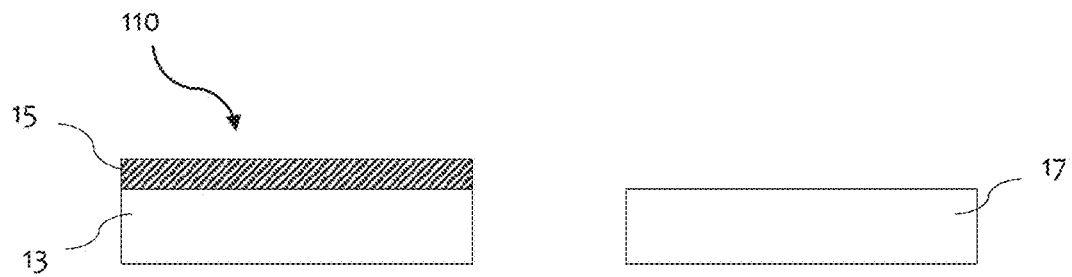
FIG. 1A, FIG. 1B, FIG. 1C, FIG. 1D, FIG. 1E, and FIG. 1F are cross-section views, partially and schematically illustrating successive steps of an example of a method of transferring a semiconductor layer from a source substrate to a destination substrate according to a first embodiment.

FIG. 1A shows, in its left-hand portion, a structure 110 comprising a source substrate 13 and a semiconductor layer to be transferred 15 and, in its right-hand portion, a destination substrate 17.

The semiconductor layer to be transferred 15 is arranged on the upper surface of substrate 13 and for example in contact therewith. Semiconductor layer 15 for example continuously extends with a substantially uniform thickness across the entire upper surface of substrate 13. Semiconductor layer 15 is for example a single-crystal layer. As an example, semiconductor layer 15 is a layer of silicon carbide (SiC), for example, monocrystalline, for example, of 4H-SiC type. As a variant, semiconductor layer 15 is made of germanium (Ge), for example, monocrystalline. The described embodiments are not limited to these specific examples.

Source substrate 13 is for example made of a semiconductor material. As an example, source substrate 13 is made of the same material as layer 15. The described embodiments are however not limited to this specific case.

The layer to be transferred 15 has, for example, a thickness in the range from 100 nm to 10 μm, for example, from 300 nm to 2 μm.

Source substrate 13 for example has a thickness in the range from 100 μm to 1 mm, for example, from 250 μm to 800 μm, for example, in the order of 350 μm.

Destination substrate 17 may be made of a semiconductor material or of a dielectric material. Destination substrate 17 is for example a semiconductor wafer, for example, made of silicon or of polysilicon carbide, for example, of 3C-SiC type.

As an example, destination substrate 17 and source substrate 13 have substantially the same shape and the same dimensions in top view. As an example, destination substrate 17 and source substrate 13 are both, in top view, of circular shape and have, for example, the same diameter.

To limit risks of breakage, destination substrate 17 and/or source substrate 13 preferably have tapered or rounded edges and a lip area, for example, over a peripheral ring-shaped band having a width in the range from 0.1 mm to 5 mm, for example from 0.2 mm to 3 mm. In other words, destination substrate 17 and/or source substrate 13 have, at their periphery, a decreasing thickness as the distance to the center of the substrate increases, for example, over a peripheral ring-shaped strip having a width in the range from 0.1 mm to 5 mm, for example, from 0.2 to 3 mm.

During the bonding of the layer to be transferred 15 onto destination substrate 17, the layer to be transferred 15 is placed into contact, by its upper surface in the orientation of FIG. 1A, on the upper surface of destination substrate 17.

In practice, and more particularly in the case where destination substrate 17 and/or source substrate 13 have tapered edges, it can be observed that the bonding of layer 15 to destination substrate 17 is incomplete at the periphery of the assembly. Indeed, on bonding of layer 15 to substrate 17, while layer 15 and substrate 17 are well contacted to the center of the assembly, they are not or only partially so at the edge of the assembly, particularly due to the peripheral taper of the substrates, and/or to possible surface unevennesses of the substrates.

At the end of a step of removal of source substrate 13, the peripheral portions of layer 15 which are not bonded or poorly bonded to destination substrate 17 break off. Thus, a peripheral ring-shaped strip of destination substrate 17 is not covered or only partially covered with layer 15.

In the absence of specific precautions, at the end of the transfer, the edges of layer 15 at the periphery of the assembly are irregular. This is due to the fact that the bonding limit between layer 15 and destination substrate 17 is irregular. This irregularity of the edges of layer 15 may cause defects likely to propagate towards the center of layer 15 during subsequent microelectronic component manufacturing steps, for example, during a step of epitaxy from the upper surface of layer 15. The defects are in particular likely to propagate in the epitaxial layer on layer 15.

It is here desired to improve the regularity or cleanness of the edges of layer 15 at the end of the transfer.

Figure 1B:
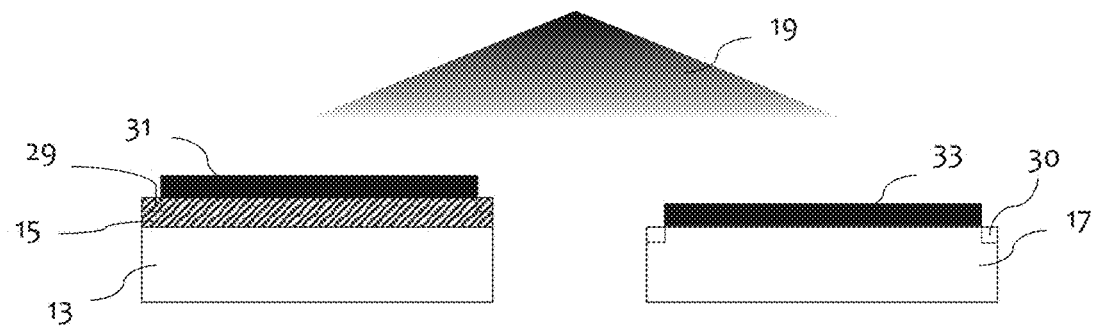

FIG. 1B illustrates a step of etching of a step 29 on the periphery of the upper surface, called bonding surface of layer 15, and of a step 30, on the periphery of the upper surface, called bonding surface of destination substrate 17.

Step 29 extends from the upper surface of layer 15, for example, in a portion of layer 15. As a variant, step 29 extends, from the upper surface of layer 15, in layer 13 and, for example, in a portion of substrate 13.

Steps 29 and 30 are carried out by an etching or ion abrasion method comprising sending onto the areas to be etched a beam of ions 19 or of atoms, for example, neutral. This step is carried out under vacuum, that is, at a pressure lower than the atmospheric pressure, for example, under ultra-high vacuum, for example under a pressure lower than $10^{-7}$ mbar, for example, lower than $10^{-8}$ mbar.

During the etch step, only the free portions of the upper surfaces of destination substrate 17 and of layer 15, that is, the portions of the upper surface of layer 15 and of destination substrate 17 which are not covered with a mask, are etched.

In the example of FIG. 1B, to form a step 29 on the periphery of the bonding surface of layer 15 only and a step 30 on the periphery of the bonding surface of destination substrate 17 only, the central portions of the bonding surfaces are each covered with a masking disk. Thus, during the etch step, a masking disk 31 covers a central portion of the bonding surface of layer 15 and a masking disk 33 covers a central portion of the bonding surface of destination substrate 17.

As an example, in vertical projection, the center of masking disk 31 coincides with the center of source substrate 13, and the center of masking disk 33 coincides with the center of destination substrate 17. As an example, the diameter of masking disk 31 is smaller than the diameter of source substrate 13 and the diameter of masking disk 33 is smaller than the diameter of destination substrate 17. The difference between the diameter of source substrate 13 and the diameter of masking disk 31 is, for example, in the range from 0.1 mm to 5 mm, for example, from 0.5 mm to 3 mm, for example, in the order of 1 mm. The difference between the diameter of destination substrate 17 and the diameter of masking disk 33 is, for example, in the range from 0.1 mm to 5 mm, for example, from 0.5 mm to 3 mm, for example in the order of 1 mm. As an example, masking disks 31 and 33 are identical, to within manufacturing dispersions.

Masking disks 31 and 33 are for example metallic and/or made of a semiconductor or insulating material. As an example, during the step of etching of steps 29 and 30, masking disk 31 is arranged on top of and in contact with the upper surface of semiconductor layer 15, and masking disk 33 is arranged on top of and in contact with the upper surface of destination substrate 17.

In the shown example, the etching of step 29 in layer 15 and the etching of step 30 in destination substrate 17 are performed simultaneously. As a variant, the etching of step 29 in layer 15 and the etching of step 30 in destination substrate 17 are performed successively.

As an example, step 29 has a depth, from the upper surface of layer 15, greater than approximately 700 nm, for example, greater than approximately 1 µm. As an example, step 30 has a depth, from the upper surface of substrate 17, greater than approximately 700 nm, for example, greater than approximately 1 µm. As an example, due to the different nature of layer 15 and of substrate 17, step 29 and step 30 do not have the same depth.

At the end of this step, masking disks 31 and 33 are removed.

Figure 1C:
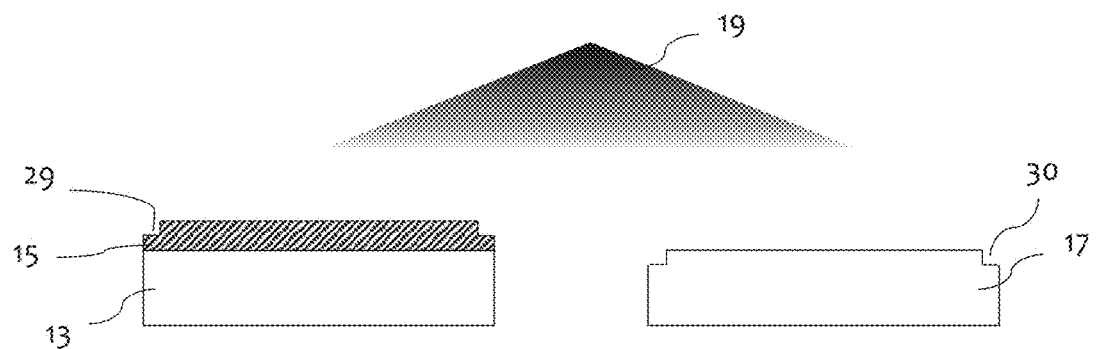

FIG. 1C illustrates a step of activation of the bonding surfaces of layer 15 and of destination substrate 17.

The method implemented during this step is a method of etching or ion abrasion similar to the method implemented during the forming of steps 29 and 30. In particular, according to an aspect of the embodiment of FIGS. 1A to 1F, the activation of the bonding surfaces by etching or ion abrasion is performed in a same ion treatment chamber as the etching of steps 29, 30. The etching energy and/or the etching time are however lower than the etching energy and/or than the etching time implemented on forming of steps 29 and 30 so as to activate the exposed surfaces without etching a significant thickness of layer 15 and of substrate 17.

During this step, the beam of ions 19 or of atoms, preferably neutral, sent onto the surfaces to be activated enables to remove, for example, possible oxides present at the surface of the surfaces to be activated while leaving dangling bonds which will be used to form covalent bonds at the placing into contact of the activated surfaces in a subsequent step. Such a bonding method allows a bonding generally called surface activated bonding or SAB. As an example, during this step, the removal of material from the surfaces to be activated is smaller than a few nanometers, for example, smaller than 5 nm. In any case, the thickness of material removed during this activation step is smaller than the thickness removed during the forming of steps 29 and 30.

As an example, during the step illustrated in FIG. 1C, the surface exposure time is for example decreased and/or the power of ion beam 19 is for example decreased with respect to the step illustrated in FIG. 1B.

In the shown example, the activation of the bonding surface of layer 15 and the activation of the bonding substrate of destination layer 17 are performed simultaneously. The activation of the bonding surface of layer 15 and the activation of the bonding surface of destination substrate 17 are performed successively with no rupture of vacuum.

As an example, during this step, the entire surface of the bonding surface of substrate 17 and the entire surface of the bonding surface of layer 15 are activated.

Figure 1D:
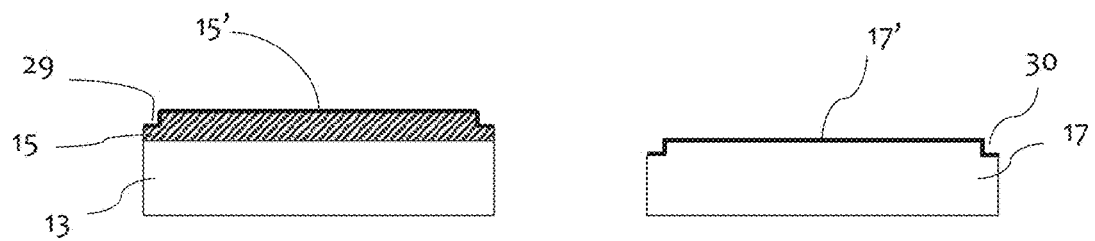

FIG. 1D illustrates structure 110 and destination substrate 17 at the end of the step of activation of the upper surfaces of destination substrate 17 and of layer 15.

At this stage, a surface 15' corresponding to the bonding surface of layer 15 which further extends in step 29 and a surface 17' corresponding to the bonding surface of destination substrate 17 which further extends in step 30 are activated in the same way as the central portions of layer 15 and of substrate 17.

Figure 1E:
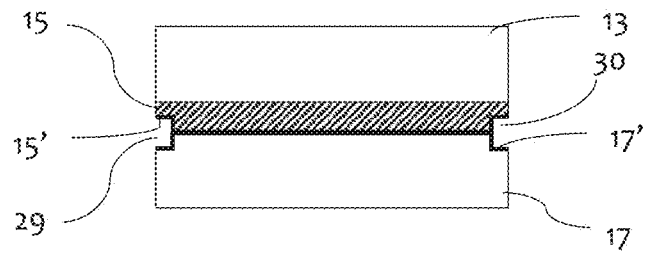

FIG. 1E illustrates a step of bonding of structure 110 onto destination substrate 17. During this step, the bonding surface 15' of layer 15 is placed into contact with the bonding surface 17' of destination substrate 17. Due to the geometry of structure 110 and of substrate 17, during this step, only a central area of the bonding surface of layer 15, delimited by step 29, is placed into contact with a central area of the bonding surface of substrate 17, delimited by step 30.

The dangling bonds formed on the bonding surface of layer 15 and the dangling bonds formed on the bonding surface of substrate 17 create, when they are placed into contact, covalent bonds ensuring the bonding of layer 15 to substrate 17. The depth of steps 29, 30 being sufficiently large, the dangling bonds formed at the periphery of layer 15, in step 29 and the dangling bonds formed at the periphery of substrate 15, in step 30, although they are placed in front of one another, do not form covalent bonds.

As an example, the bonding step is performed under a temperature in the range from 10° C. to 400° C., for example, from 10° C. to 40° C., for example, at room temperature.

Figure 1F:
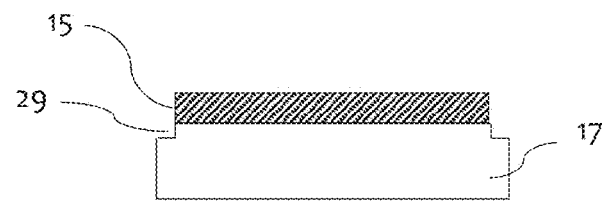

FIG. 1F illustrates the structure obtained at the end of a step of removal of source substrate 13 and of the structure illustrated in FIG. 1E.

As an example, substrate 13 is made of the same semiconductor material as layer 15, and a buried layer (not visible in the drawings) implanted, for example with hydrogen ions (H+), separates layer 15 from source substrate 13. As an example, structure 110 is initially a single-crystal semiconductor wafer, which is implanted from its upper surface, for example, with hydrogen ions, to create the buried implanted layer separating the layer 15 to be transferred from source substrate 13. As an example, the removal of source substrate 13 may comprise a step of thermal anneal resulting in fracturing structure 110 in the plane of the buried implanted layer, to enable to remove source substrate 13 and to only keep layer 15 on destination substrate 17.

More generally, the removal of substrate 13 may be performed by any other known method of removal of a source substrate during a transfer of a semiconductor layer from a source substrate to a destination substrate, for example, by grinding, or by a laser lift-off method.

During the removal of source substrate 13, only the central area of the layer to be transferred 15 which is not in front of steps 29 and 31 remains bonded to destination substrate 17. The peripheral portion of destination substrate 17 located in front of steps 29 and 30 however remain free, that is, not covered with layer 15.

Thus, at the end of the method illustrated in FIGS. 1A to 1F, the transferred layer 15 has a clean and regular edge substantially corresponding to the edge of step 29 and/or 30.

The steps of activation of the bonding surfaces (FIG. 1C) and bonding (FIG. 1E) are carried out with no rupture of vacuum, for example within the same equipment, for example comprising an activation chamber where the etch step of FIG. 1B and the activation step of FIG. 1C are implemented, and a bonding chamber where the bonding step of FIG. 1E is implemented.

In practice, during the bonding step (FIG. 1E), it is desired to align the structures so as to have the central areas of the bonding surface of layer 15, delimited by step 29 and the bonding surface of substrate 17, delimited by step 30, coincide. However, even if the alignment is not perfect, the provided solution enables to obtain a clean edge of the transferred layer, since only the portions of the bonding surface placed into contact adhere to each other.

In the example illustrated in FIG. 1B, the etching of layer 15 is performed through a masking disk 31 to form a step 29 in layer 15 and the etching of destination substrate 17 is performed through a masking disk 33 to form a step 30 in destination substrate 17. As a variant, a masking disk may be provided on layer 15 only or on destination substrate 17 only to form a step on a single one of the two bonding surfaces.

FIG. 2A, FIG. 2B, FIG. 2C, FIG. 2D, FIG. 2E, and FIG. 2F are cross-section views partially and schematically illustrating successive steps of an example of a method of transfer of a semiconductor layer from a source substrate to a destination substrate according to a second embodiment.

The second embodiment is similar to the first embodiment illustrated in FIGS. 1A to 1F, with the difference that, in the second embodiment, the activation of the bonding surfaces is performed by deposition of a thin layer of a bonding material providing dangling bonds, then enabling to form covalent bonds at the placing into contact of the activated surfaces. The elements common with the method of FIGS. 1A to 1F will not be detailed again hereafter. Only the differences with the method of FIGS. 1A to 1F will be highlighted.

Figure 2A:
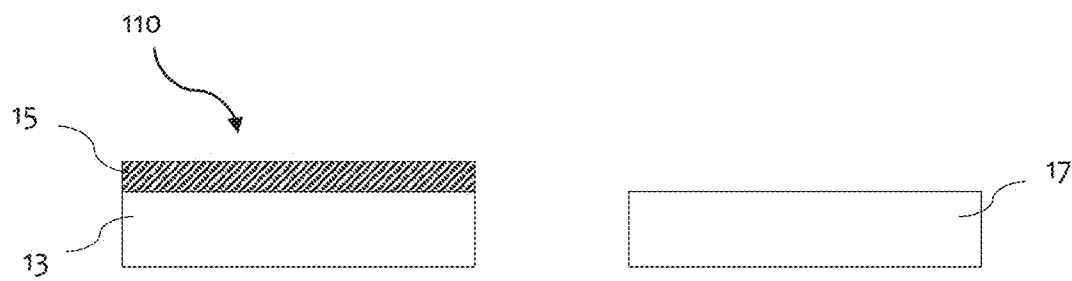
FIG. 2A, FIG. 2B, FIG. 2C, FIG. 2D, FIG. 2E, and FIG. 2F are cross-section views, partially and schematically illustrating successive steps of an example of a method of transferring a semiconductor layer from a source substrate to a destination substrate according to a second embodiment.

FIG. 2A illustrates, similarly to FIG. 1A, in its left-hand portion, the structure 110 comprising source substrate 13 and the semiconductor layer to be transferred 15 and, in its right-hand portion, destination substrate 17.

Figure 2B:
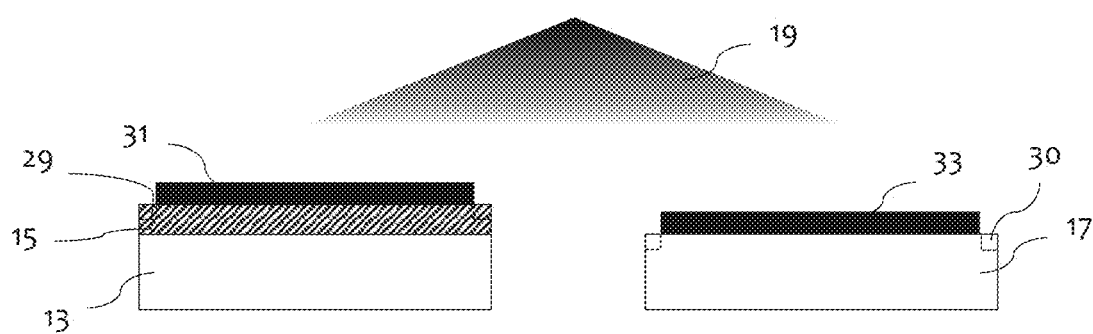

FIG. 2B illustrates, similarly to FIG. 1B, a step of etching of step 30, on the periphery of the upper surface of destination substrate 17 and of step 29 on the periphery of the upper surface of layer 15.

Figure 2C:
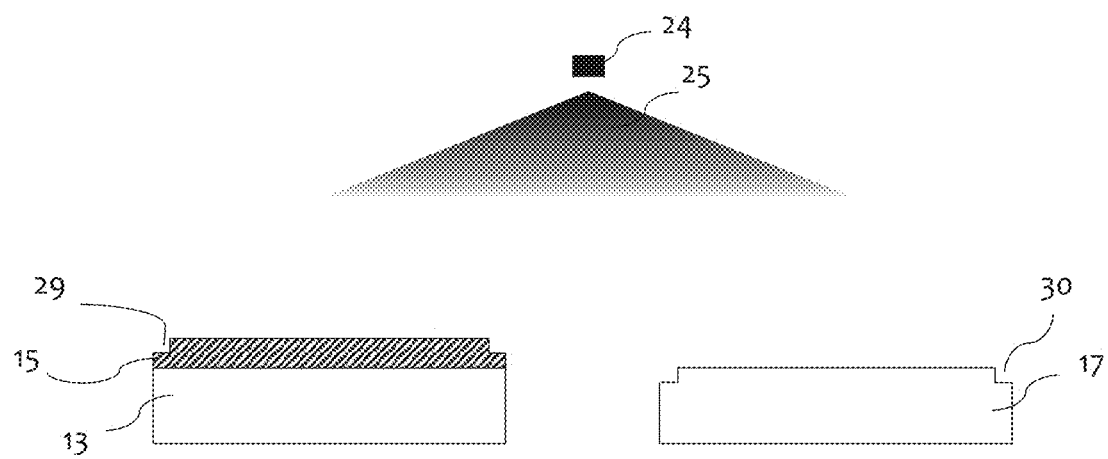

FIG. 2C illustrates a step of activation of the bonding surface, of layer 15, and of the bonding surface, of destination substrate 17.

This activation step comprises depositing a thin activation layer, also called bonding layer, onto the surfaces to be activated. This enables to create dangling bonds which will be used to form covalent bonds during the placing into contact of the activated layers in a subsequent step. This bonding technique is called atomic diffusion bonding or ADB.

As an example, during this step, a beam of ions or atoms, for example of neutral gas, for example, of argon, bombards a target 24 made of a material having its atoms 25 break off and uniformly deposit in a thin layer onto the surface(s) to be activated. As an example, the target is metallic, for example, made of tungsten or of titanium. As a variant, target 24 is made of a semiconductor material, for example, of silicon, of germanium, etc.

This step is carried out under vacuum, that is, under the atmospheric pressure, for example, under ultra-high vacuum, for example under a pressure lower than $10^{-7}$ mbar, for example, lower than $10^{-8}$ mbar.

In the embodiment of FIGS. 2A to 2F, the activation of the bonding surfaces by sputtering of a bonding material is performed in the same ion treatment chamber as the etching of steps 29, 30.

In the shown example, the activation of the bonding surface of layer 15 and the activation of the bonding surface of destination substrate 17 are performed simultaneously. As a variant, the activation of the bonding surface of layer 15 and the activation of the bonding surface of destination surface 17 are performed successively with no rupture of vacuum.

FIG. 1D illustrates structure 110 and destination substrate 17 at the end of the step of activation of the upper surfaces of destination substrate 17 and of layer 15.

At this stage, the bonding surface of layer 15 and the bonding surface of destination substrate 17 are activated, that is, topped with a layer 27 made of the material of target 24. As an example, layers 27 each have a thickness greater than 0.2 nm, for example smaller than 100 nm. As an example, layer(s) 27 have a thickness in the range from 1 nm to 20 nm. In this embodiment, layer 27 further extends in step 29 and in step 30, these layers are thus activated in the same way as the central portions of layer 15 and of substrate 17.

Figure 2D:
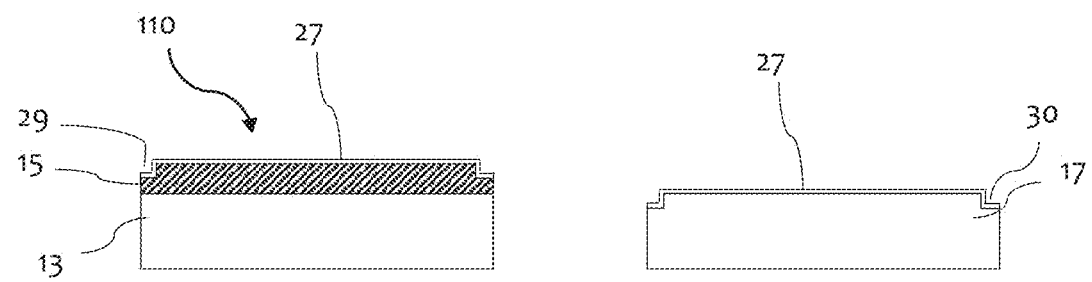
Figure 2E:
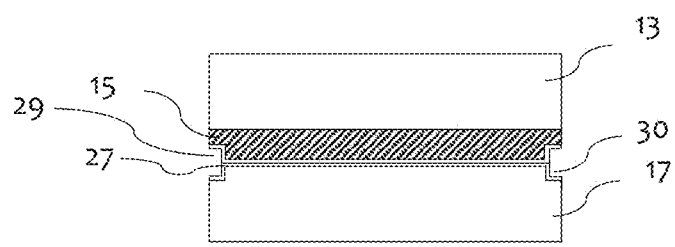

FIG. 2E illustrates a step of bonding of the structure 110 of FIG. 2D onto the destination substrate 17 of FIG. 2C. During this step, the central portion of the bonding surface of layer 15 delimited by step 29 is placed into contact with the central portion of the bonding surface of destination substrate 17 delimited by step 30. More particularly, the layer 27 formed on layer 15 and the layer 27 formed on destination substrate 17 are placed into contact. Due to the geometry of structure 110 and of substrate 17, during this step, only a central area of the bonding surface of layer 15, delimited by step 29, is placed into contact with a central area of the bonding surface of substrate 17, delimited by step 30.

The dangling bonds of the layer 27 deposited on layer 15 and those of the layer 27 deposited on substrate 17 create, when they are placed into contact, covalent bonds ensuring the bonding of layer 15 to substrate 17. The depth of steps 29, 30 being sufficiently large, the dangling bonds formed at the periphery of layer 15, in step 29 and the dangling bonds formed at the periphery of substrate 15, in step 30, although they are placed in front of one another, do not form covalent bonds.

As an example, the bonding step is carried out under a temperature in the range from 10° C. to 400° C., for example from 10° C. to 40° C., for example at room temperature.

As an example, the interface resistivity between layer 15 and destination substrate 17 is lower than $10^{-3}$ $\Omega \cdot cm^{-2}$, for example, lower than $10^{-5}$ $\Omega \cdot cm^{-2}$. This enables the bonding to be electrically transparent.

Figure 2F:
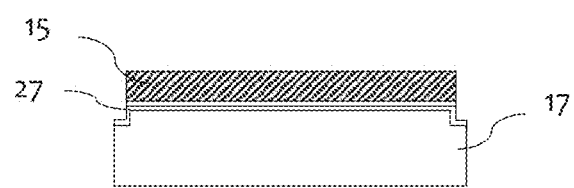

FIG. 2F illustrates the structure obtained at the end of a step of removal of source substrate 13 from the structure illustrated in FIG. 2E.

As an example, substrate 13 is made of the same semiconductor material as layer 15, and a buried layer (not visible in the drawings) implanted, for example with hydrogen ions (H+), separates layer 15 from source substrate 13. As an example, structure 110 is initially a single-crystal semiconductor wafer, which is implanted from its upper surface, for example, with hydrogen ions, to create the buried implanted layer separating the layer 15 to be transferred from source substrate 13. As an example, the removal of source substrate 13 may comprise a step of thermal anneal resulting in fracturing structure 110 in the plane of the buried implanted layer, to enable to remove source substrate 13 and to only keep layer 15 on destination substrate 17.

More generally, the removal of substrate 13 may be performed by any other known method of removal of a source substrate during a transfer of a semiconductor layer from a source substrate to a destination substrate, for example, by grinding, or by a laser lift-off method.

As previously, during the removal of source substrate 13, only the central area of the layer to be transferred 15 which is not in front of steps 29 and 30 remains bonded to destination substrate 17. The peripheral portion of destination substrate 17, located in front of steps 29 and 30 however remains free, that is, not covered with layer 15.

Thus, at the end of the method illustrated in FIGS. 2A to 2F, the transferred layer 15 has a clean and regular edge substantially corresponding to the edge of step 29 and/or 30.

The steps of activation of the bonding surfaces (FIG. 2C) of and bonding (FIG. 2E) are carried out with no rupture of vacuum, within the same equipment, for example comprising an activation chamber where the activation step of FIG. 2C is implemented, and a bonding chamber where the bonding step of FIG. 2E is implemented.

In the example illustrated in FIG. 2B, the etching of layer 15 is performed through masking disk 31 to form a step 29 in layer 15 and the etching of destination substrate 17 is performed through a masking disk 33 to form a step 30 in destination substrate 17. As a variant, a masking disk may be provided on layer 15 only or on destination substrate 17 only to form a step on a single one of the two bonding surfaces.

In practice, during the bonding step, it is desired to align the structures to have the central areas of layers 27 delimited by steps 29 and 30 coincide. However, even if the alignment is not perfect, the provided solution enables to obtain a clean edge of the transferred layer, since only the portions of layers 27 placed into contact adhere to each other.

An advantage of the method of FIGS. 1A to 1F and of FIGS. 2A to 2F is that the etching of steps 29 and/or 30 enables to improve the sharpness of the limit between the bonded central area and the non-bonded peripheral area of layer 15.

Various embodiments and variants have been described. Those skilled in the art will understand that certain features of these various embodiments and variants may be combined, and other variants will occur to those skilled in the art. In particular, the described embodiments are not limited to the examples of materials and of dimensions mentioned in the present disclosure.

Further, the embodiments have been described for circular source and destination substrate, however they may have a different shape.

Further, although the provided methods are advantageous for the transfer of a semiconductor layer from a source substrate to a destination substrate, they may also be implemented to transfer layers of different natures such as metal layer or dielectric layers from a source substrate to a destination substrate.

Finally, the practical implementation of the described embodiments and variations is within the abilities of those skilled in the art based on the functional indications given hereabove.

The invention claimed is:

1. Method of transferring a layer from a source substrate to a destination substrate, comprising the following steps:

a) arranging a masking disk on a central portion of a bonding surface of said layer and/or of the destination substrate;

b) implementing an ion etching to form a step in front of a peripheral portion, not covered with the masking disk, of the bonding surface of said layer and/or of the destination substrate;

c) removing the masking disk;

d) activating the bonding surface of said layer and the bonding surface of the destination substrate by ion etching or ion deposition of a bonding material; and e) after step d), placing into contact the bonding surface of said layer with the bonding surface of the destination substrate, wherein steps b) and d) are successively implemented in a same ion treatment chamber; and wherein steps d) and e) are implemented under vacuum, with no rupture of vacuum between the two steps.

2. Method according to claim 1, wherein the destination substrate and/or the source substrate has tapered edges across a first width.

3. Method according to claim 2, wherein, after step b), the step extends, from the edge of said layer and/or from the edge of the destination substrate across a width greater than or equal to the first width.

4. Method according to claim 1, wherein the disk has a diameter smaller than the diameter of the source substrate and/or than the diameter of the destination substrate.

5. Method according to claim 1, comprising, after step e), a step f) of removal of the source substrate.

6. Method according to claim 5, wherein step f) comprises an anneal step resulting in fracturing the assembly obtained at the end of step e), in the plane of an implanted buried layer separating said layer from the source substrate.

7. Method according to claim 1, wherein said layer is a semiconductor layer.

8. Method according to claim 5, comprising, after step f), a step of epitaxy on top of and in contact with the surface of said layer opposite to the destination substrate.

9. Method according to claim 1, wherein, after step b), the step extends down to a depth, from the bonding surface of said layer and/or the bonding surface of the destination substrate, greater than 700 nm.

10. Method according to claim 1, wherein step d) consists of the deposit of a bonding layer onto the bonding surface of said layer and/or onto the bonding surface of the destination substrate.

11. Method according to claim 10, wherein the bonding layer has a thickness in the range from 0.2 nm to 100 nm, for example, in the range from 1 nm to 20 nm.

* * * * *